(12) United States Patent
Solhusvik

(10) Patent No.: US 8,723,975 B2
(45) Date of Patent: May 13, 2014

(54) HIGH-DYNAMIC-RANGE IMAGING DEVICES

(75) Inventor: Johannes Solhusvik, Haslum (NO)

(73) Assignee: Aptina Imaging Corporation, George Town (KY)

(*) Notice: Subject to any disclaimer, the term of this patent is extended or adjusted under 35 U.S.C. 154(b) by 385 days.

(21) Appl. No.: 13/077,529

(22) Filed: Mar. 31, 2011

(65) Prior Publication Data
US 2012/0188423 A1    Jul. 26, 2012

Related U.S. Application Data

(60) Provisional application No. 61/435,713, filed on Jan. 24, 2011.

(51) Int. Cl.
*H04N 5/235*    (2006.01)
(52) U.S. Cl.
USPC ............. 348/221.1; 348/229.1; 348/230.1
(58) Field of Classification Search
USPC .......... 348/221.1, 222.1, 229.1, 224.1, 227.1, 348/362–366, 370, 220.1, 345, 349, 356
See application file for complete search history.

(56) References Cited

U.S. PATENT DOCUMENTS

| | | | |
|---|---|---|---|
| 7,667,176 B2 | 2/2010 | Olsen et al. | |
| 7,829,832 B2 | 11/2010 | Mauritzson et al. | |
| 2006/0131484 A1 | 6/2006 | Peting | |
| 2006/0238630 A1* | 10/2006 | Moody et al. | 348/247 |
| 2008/0231737 A1* | 9/2008 | Weale et al. | 348/308 |
| 2010/0002094 A1* | 1/2010 | Solhusvik et al. | 348/230.1 |
| 2010/0231771 A1* | 9/2010 | Yaghmai | 348/308 |
| 2010/0302399 A1 | 12/2010 | Lin | |
| 2011/0013064 A1 | 1/2011 | Lahav et al. | |

* cited by examiner

*Primary Examiner* — Lin Ye
*Assistant Examiner* — Euel Cowan
(74) *Attorney, Agent, or Firm* — Treyz Law Group; Louis R. Levenson; Michael H. Lyons

(57) ABSTRACT

High-dynamic-range images may be produced by combining multiple integration periods of varying duration, wherein each integration is obtained using a global shutter operation. Charge accumulated during a first integration period may be stored on a first storage node while charge accumulated during a second and third integration time are carried out. Storage of charges accumulated during the second and third integration periods on a second storage node within a pixel while charge is stored on the first storage node allows capture of a global-shutter-based, high-dynamic-range image. A global-shutter-based image capture base on at least three integration time periods may provide enhanced dynamic range.

14 Claims, 7 Drawing Sheets

HIGH-DYNAMIC-RANGE IMAGING DEVICES

This application claims the benefit of provisional patent application No. 61/435,713, filed Jan. 24, 2011, which is hereby incorporated by reference herein in its entirety.

BACKGROUND

The present invention relates to image sensors and, more particularly, to imaging devices with image sensors that may be used to produce high-dynamic-range images in a global shutter configuration.

Image sensors are commonly used in electronic devices such as cellular telephones, cameras, and computers to capture images. In a typical arrangement, an electronic device is provided with a single image sensor and a single corresponding lens. Some electronic devices use arrays of image sensors.

In certain applications, such as when acquiring still or video images of a scene with a large range of light intensities, it may be desirable to capture high-dynamic range images. While highlight and shadow detail may be lost using a conventional image sensor, highlight and shadow detail may be retained using image sensors with high-dynamic-range capabilities.

For applications in which images are captured using a non-stationary imaging device (i.e. an imaging device in a moving automobile), it may be desirable to capture images with a global shutter scheme. A moving imaging device that uses a rolling shutter scheme may undesirably capture an image that is distorted or skewed. Images captured using the global shutter scheme are not distorted or skewed. The global shutter scheme requires additional storage in the imaging sensor. Additional storage in the imaging sensor requires physical space which reduces the available space for photosensitive elements. This may reduce the efficiency of the imaging sensor.

It would therefore be desirable to be able to provide imaging devices that use the global shutter scheme with improved dynamic range capabilities.

DETAILED DESCRIPTION

Imaging systems are widely used in electronic devices such as digital cameras, computers, cellular telephones, and other electronic devices. These electronic devices may include image sensors that gather incoming light to capture an image. The image sensors may include at least one image pixel array. The pixels in the image pixel array may include photosensitive elements such as photodiodes that convert the incoming light into digital data. Image sensors may have any number of pixels (e.g., hundreds or thousands or more). A typical image sensor may, for example, have hundreds of thousands or millions of pixels (e.g., megapixels).

Figure 1:
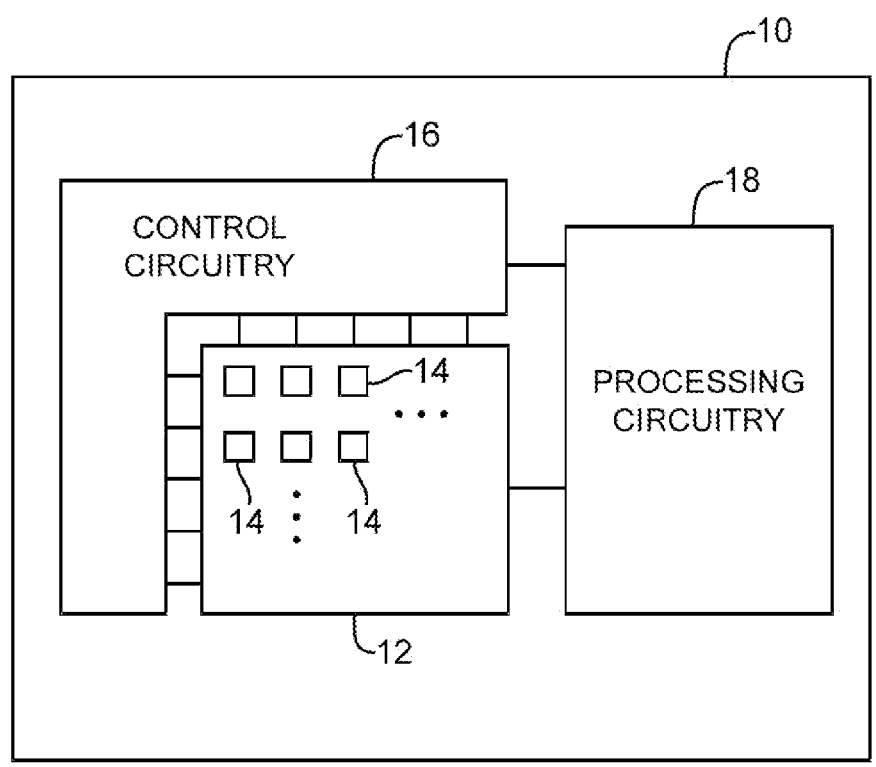
FIG. 1 shows an illustrative imaging device that can be used to capture high-dynamic-range images using a global shutter operation.

FIG. 1 is a diagram of an illustrative electronic device that uses an image sensor to capture images. Device 10 may be a portable electronic device such as a camera, a cellular telephone, a video camera, or other imaging device that captures imaging data. Device 10 may include at least one image pixel array 12. Image pixel array 12 may include image pixels 14 arranged in pixel rows and pixel columns or other suitable arrangements. Array control circuitry 16 may be used to configure image pixel array 12 to perform desired operations. Array control circuitry 16 may include, for example, readout circuitry that is used for controlling image data capture and readout processes, row decoder circuitry used for issuing control signals to select a row of image pixels in array 12 (e.g., by asserting reset signal RST in desired rows, by asserting row select signal RS in a selected row to read data from the selected row), column control circuitry, and other peripheral circuitry. Image pixel array 12 may provide image data to processing circuitry 18.

Processing circuitry 18 may include one or more integrated circuits (e.g., image processing circuits, microprocessors, storage devices such as random-access memory and non-volatile memory, etc.) and may be implemented using components that are separate from image pixel array 12 and/or that form part of image pixel array 12 (e.g., circuits that form part of an integrated circuit that includes image pixels 14 or an integrated circuit within array 12 that is associated with image pixels 14). Image data that has been captured by image pixel array 12 may be processed and stored using processing circuitry 18. Processed image data may, if desired, be provided to external equipment (e.g., a computer or other device) using wired and/or wireless communications paths coupled to processing circuitry 18.

Dynamic range may be defined as the luminance ratio of the brightest element in a given scene to the darkest element the given scene. Typically, cameras and other imaging devices capture images having a dynamic range that is smaller than that of real-world scenes. It may therefore be difficult to capture representative images of scenes that have regions with high contrast, such as scenes that have portions in bright sunlight and portions in dark shadows.

Recently, imaging devices have been developed that can produce high-dynamic-range (HDR) images. An image may be considered an HDR image if it has been generated using imaging processes or software processing designed to increase dynamic range. As an example, HDR images may be captured by a digital camera using a multiple integration method. In particular, multiple images of the same scene may be captured using different exposure (or integration) times. A first image using a short-integration time may better capture details of brightly lit portions of the scene, whereas a second image generated using a long-integration time may better capture details of dark portions of the scene. The first and second images may be combined into a composite image that resolves the brightly lit as well as the dark portions of the image.

Combining more images (i.e. images with different exposure times) into a single HDR image may require additional storage circuitry, thereby reducing the available space for photosensitive components. As a result, pixel efficiency is reduced. This limitation is further constrained by the desire to capture an image using a global shutter scheme which may itself require additional storage circuitry within each image pixel.

The image pixels may each include a photodiode, floating diffusion region, and a local storage region. With a global shutter scheme, all of the pixels in an image sensor are reset simultaneously. The transfer operation is then used to simultaneously transfer the charge collected in the photodiode of each image pixel to the associated storage region. Data from each storage region may then be read out on a per-row basis. The formation of storage regions for global shutter operations further consumes valuable circuit real estate. In a conventional global shutter scheme, an HDR image is generated based on only two integration periods.

Figure 2:
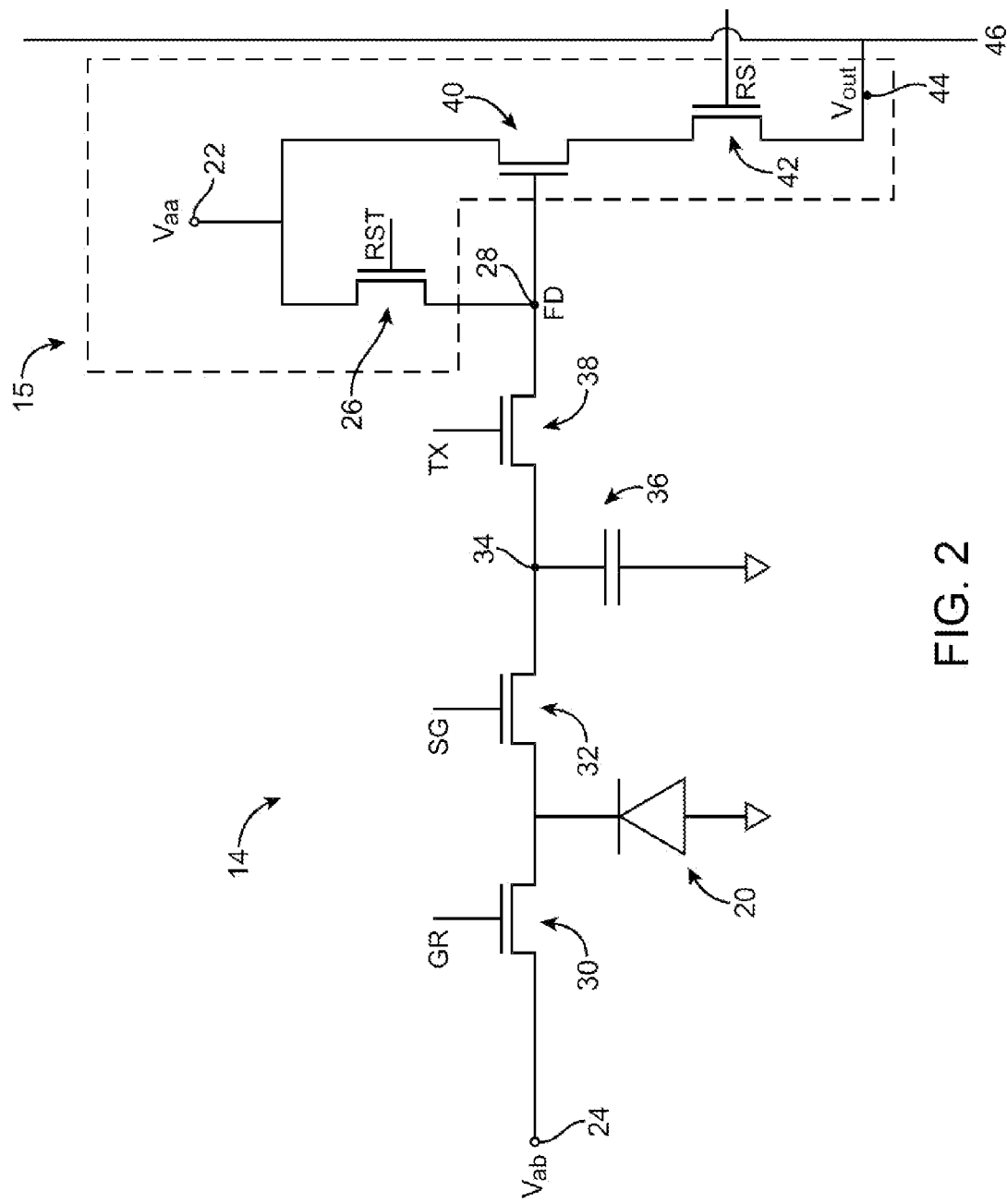
FIG. 2 is a diagram of an image pixel that can be used to support high-dynamic-range image capture using a global shutter operation.

FIG. 2 is a circuit diagram of image pixel 14. As shown in FIG. 2, pixel 14 includes a photosensitive element such as photodiode 20. A positive power supply voltage Vaa may be supplied at positive power supply terminal 22. A second power supply voltage Vab may be supplied at second power supply terminal 24. Incoming light may be collected by photodiode 20 after passing through a color filter structure. Photodiode 20 generates charge (e.g. electrons) in response to receiving impinging photons. The amount of charge that is collected by photodiode 20 depends on the intensity of the impinging light and the exposure duration (or integration time).

Before an image is acquired, reset control signal RST may be asserted. Asserting signal RST turns on reset transistor 26 and resets charge storage node 28 (also referred to as floating diffusion region FD) to Vaa. Reset control signal RST may then be deasserted to turn off reset transistor 26. Similarly, prior to charge integration, a global reset signal GR may be pulsed to reset photodiode 20 to power supply voltage Vab (e.g. by passing Vab to photodiode 20 through global reset transistor 30).

Pixel 14 may include a storage transistor 32 operable to transfer charge from photodiode 20 to storage node (sometimes called a charge storage region or storage region) 34. Charge storage region 34 may be a doped semiconductor region (e.g., a doped silicon region formed in a silicon substrate by ion implantation, impurity diffusion, or other doping techniques) capable of temporarily storing charge transferred from photodiode 20. Pixel 14 may include a transfer gate (transistor) 38. Transfer gate 38 may have a gate terminal that is controlled by transfer control signal TX. Transfer signal TX may be pulsed to transfer charge from storage region 34 to charge storage region 28 (sometimes called floating diffusion region). Floating diffusion region 28 may be a doped semiconductor region (e.g., a region in a silicon substrate that is doped by ion implantation, impurity diffusion, or other doping processes). Floating diffusion region 28 serves as another storage region (e.g. regions 36 and 38 may exhibit respective capacitance values and may be used to store charge during image data gathering operations).

Pixel 14 may also include readout circuitry such as charge readout circuit 15. Charge readout circuit 15 may include row-select transistor 42 and source-follower transistor 40. Transistor 42 may have a gate that is controlled by row select signal RS. When signal RS is asserted, transistor 42 is turned on and a corresponding signal Vout (e.g. an output signal having a magnitude that is proportional to the amount of charge at floating diffusion node 28), is passed onto output path 44.

In a typical image pixel array configuration, there are numerous rows and columns of pixels 14. A column readout path such as output line 46 may be associated with each column of pixels 14 (e.g. each image pixel 14 in a column may be coupled to output line 46 through respective row-select transistors 42). Signal RS may be asserted to read out signal Vout from a selected image pixel onto column readout path 46. Image data Vout may be fed to processing circuitry 18 for further processing. The circuitry of FIG. 2 is merely illustrative. If desired, pixel 14 may include other pixel circuitry.

Figure 3:
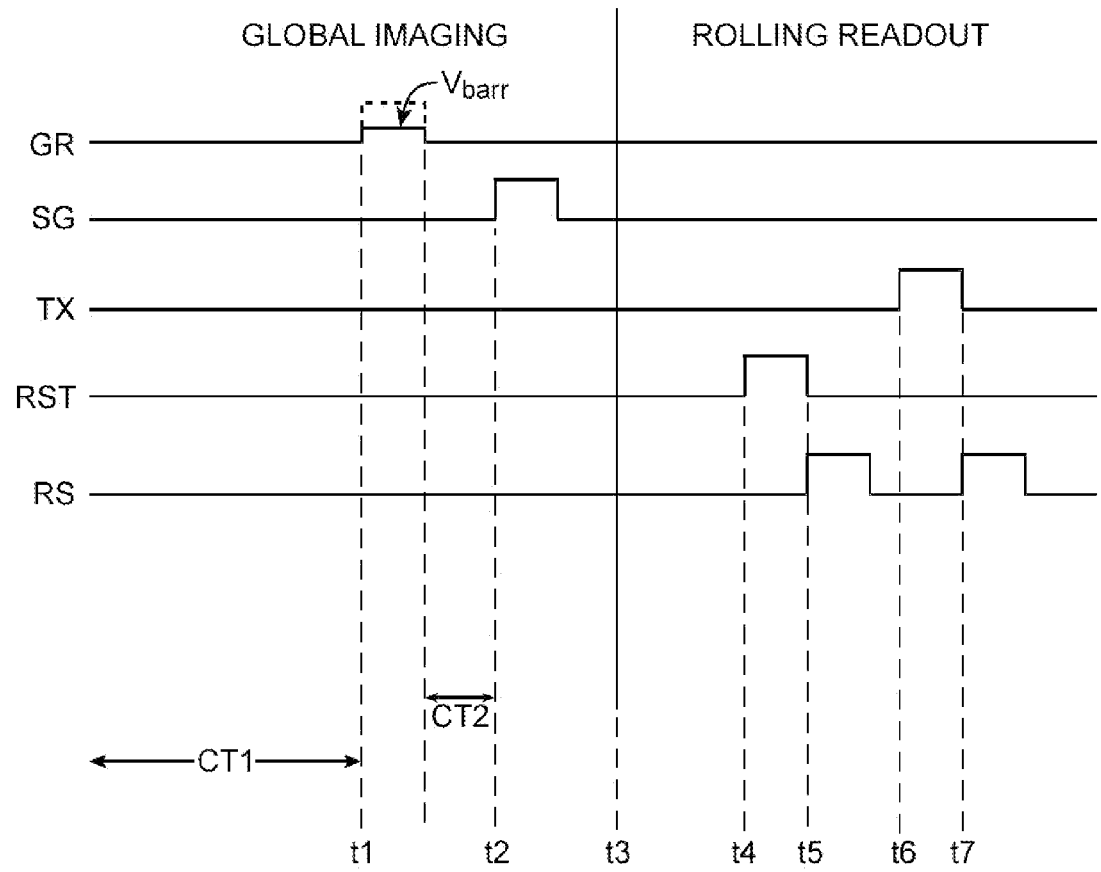
FIG. 3 is a timing diagram showing relevant signal behavior during conventional high-dynamic-range image capture using a global shutter operation.

FIG. 3 is a timing diagram of a conventional HDR image capture using a global shutter scheme. After the reset operation, a conventional HDR image capture in a global shutter operation begins by allowing the photodiodes in each pixel 14 of array 12 to integrate charge for a time CT1. At time t1, global reset signal GR is momentarily raised to an intermediate barrier voltage level $V_{barr}$ to partially reset each photodiode 20. Raising GR to a voltage level that is less than the positive power supply voltage may sometime be referred to as performing a "soft" reset. This allows excess charge in photodiodes 20 exposed to bright regions of a real-world scene to drain through power supply terminal 24. Photodiodes 20 exposed to darker regions of the scene will not have accumulated enough charge to surpass voltage level $V_{barr}$ and will not be affected by this soft GR pulse. Photodiodes 20 that accumulated enough charge to exceed $V_{barr}$ will be reset to $V_{barr}$. After the soft GR pulse, photodiodes 20 integrate charge for a second time period CT2. Time period CT2 may be substantially shorter than time period CT1. At time t2 (i.e., after time CT2 following the falling edge of signal GR), storage gate signal SG is asserted to transfer charge accumulated in photodiodes 20 to storage regions 34.

At time t3, information gathered during the two integration phases CT1 and CT2 is stored in region 34. Charge stored in region 34 may then be read out using a rolling correlated-double-sampling (CDS) readout process. A typical CDS readout scheme is shown following time t3 in FIG. 3. At time t4, reset signal RST may be pulsed to reset floating diffusion region 28 to the reset voltage. At time t5, the reset voltage is then sampled using row select transistor 42 by pulsing row-select signal RS. Sampled reset voltage $V_{rst}$ is conveyed through output path 44 to column readout line 46 to processing circuitry 18. At time t6, transfer gate control signal TX is asserted to turn on transfer gate 24. When transfer transistor 24 is turned on, charge that has been stored in storage region 34 is transferred to floating diffusion region 28. At time t7, row-select signal RS is pulsed high to read out corresponding image data signal Vout onto path 46. Image data signal Vout read out using this approach is then passed to circuitry 18 for further processing. Processing circuitry 18 then combines $V_{rst}$ and Vout (taking into account integration duration CT1 and CT2) to produce an HDR image.

Figure 4:
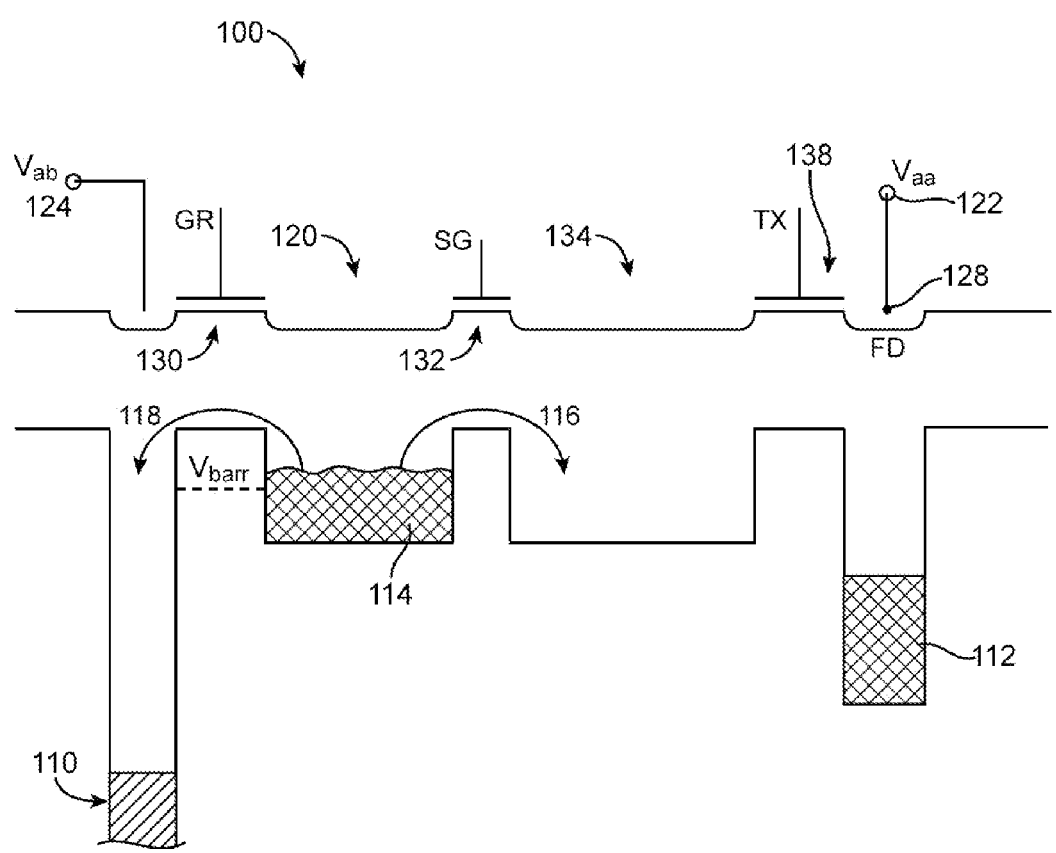
FIG. 4 is a cross-sectional side view of an image pixel and a diagram illustrating charge transfer operations involved in capturing high-dynamic-range image data with a global shutter operation in accordance with the present invention.
Figure 5:
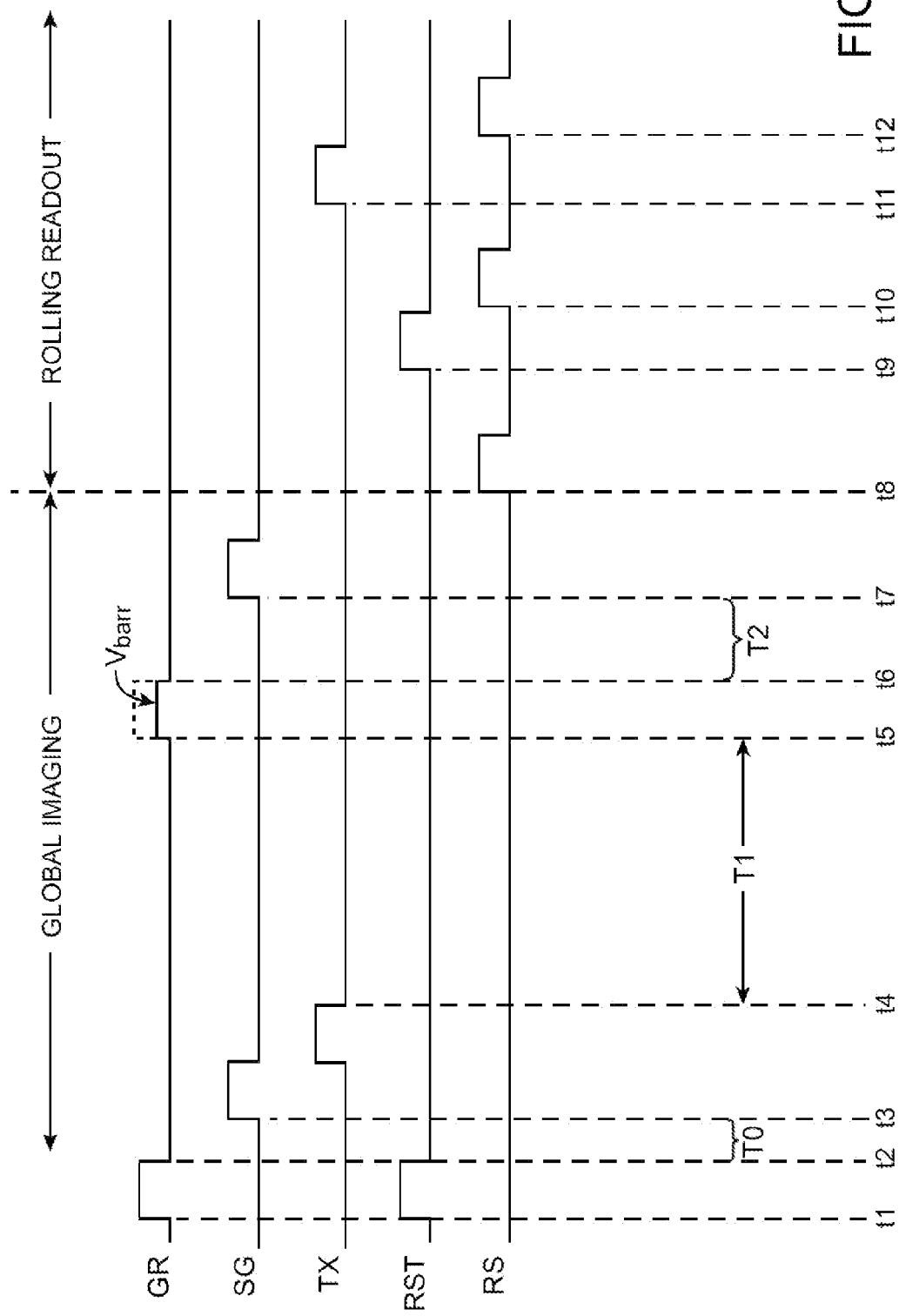
FIG. 5 is a timing diagram showing relevant signal behavior during an illustrative high-dynamic-range image capture using a global shutter operation and rolling readout operation in accordance with an embodiment of the present invention.

The dynamic range of a captured image can further be improved by performing an HDR image capture based on a global shutter operation illustrated in FIG. 4. The dynamic range can further be enhanced by performing three integration periods of different durations, whereas conventional global-shutter based image capture schemes employ only two integration periods. FIG. 5 is a timing diagram showing the behavior of relevant control signals during the global-shutter based HDR image capture of FIG. 4. The method described in connection with FIGS. 4 and 5 may be performed using the pixel architecture of FIG. 2.

A cross-sectional side view of a representative pixel is shown in FIG. 4. As shown in FIG. 4, pixel circuit 100 may have a pixel architecture similar to pixel circuit 14 of FIG. 2. Pixel circuit 100 may comprise a photodiode 120, a floating diffusion region 128, and a local storage region 134. Pixel 100 may further comprise a global reset transistor 130 for resetting photodiode 120 and a storage gate transistor 132 operable to transfer charge from photodiode 120 to storage region 134. Pixel 100 may also contain transfer transistor 138 having a gate terminal configured to receive transfer signal TX. Pixel 100 may be supplied with power supply voltages such as voltage Vaa at power supply terminal 122 and Vab at power supply terminal 124. Other pixel architectures and readout circuits may be used, if desired.

At time t1, global reset signal GR and reset signal RST may be pulsed high to reset photodiode 120 and floating diffusion region 128 (see, e.g., FIG. 5). At time t2, photodiode 120 may be used to accumulate charge during a first integration time period T0. At time t3, charge 112 accumulated by photodiode 120 during integration time T0 is transferred to floating diffusion region 128 by sequentially pulsing signal SG to enable storage gate 132 and then signal TX to enable transfer gate 138. Once charge 112 has been transferred to floating diffusion region 128, at time t4, photodiode 120 may begin to accumulate charge during a second integration time period T1 at time t4.

At time t5, a soft pulse of signal GR may be asserted to reset photodiode 120 to an intermediate barrier voltage $V_{barr}$. Charge accumulated on photodiode 120 resulting in a voltage in excess of barrier voltage $V_{barr}$ is drained through global reset transistor 130 in the direction of arrow 118 (FIG. 4). At time t6, photodiodes 120 integrate charge for a third time period T2. Third time period T2 may be substantially shorter than second time period T1 and substantially longer than first time period T0. At time t7 (i.e., time T2 after the falling edge of signal GR), signal SG is asserted to transfer charge accumulated in photodiode 120 during integration times T1 and T2 to storage region 134, as indicated by arrow 116 of FIG. 4. Capturing an image using three integration periods of varying duration using the approach described in connection with FIGS. 4 and 5 may provide desired dynamic range capabilities while maintaining a global shutter scheme.

Charge 112 stored on floating diffusion region 128 and charge 114 stored on storage node 134 may then be read out using an illustrative rolling readout scheme as shown in FIG. 5. At time t8 in FIG. 5, row-select signal RS may be pulsed high to read out signal $V1_{out}$ associated with charge 112 onto column output line 46. Readout circuitry for reading out charges 112 and 114, accumulated between times t1 and t8, may be similar to readout circuitry of FIG. 2. Only a selected one of the row-select signals may be asserted during rolling pixel readout operations.

At time t9, reset signal RST may be pulsed to reset floating diffusion region 128 to reset voltage $V_{rst}$. At time t10, signal $V_{rst}$ may then be sampled by pulsing a row-select signal RS to enable row-select transistor 42 with signal RS. Signal RS may be asserted after signal RST is pulsed (i.e., the rising edge of signal RST at time t10 may occur after the falling edge of signal RST). If desired, signal RS may be asserted during the signal RST pulse (i.e., the rising edge of signal RS at time t10 may occur after the rising edge of signal RST and before the falling edge of signal RST). Sampled reset voltage $V_{rst}$ may then be conveyed through an output path such as output path 44 to a column readout line such as column readout line 46 to processing circuitry such as processing circuitry 18. At time t11, transfer gate control signal TX may then be asserted to turn on transfer gate 138.

When transfer transistor 138 is turned on, charge that has been stored in storage region 134 is transferred to floating diffusion region 128. At time t12, row-select signal RS may be pulsed high to read out corresponding image data $V2_{out}$ onto output path 46. Signal RS may be asserted after signal TX is pulsed (i.e., the rising edge of signal RS at time t12 may occur after the falling edge of signal TX). If desired, signal RS may be asserted during the signal TX pulse (i.e., the rising edge of signal RS at time t12 may occur after the rising edge of signal TX and before the falling edge of signal TX). Image data read out using this approach may then be passed to processing circuitry 18 for further processing. Processing circuitry 18 may then combine $V_{rst}$, $V2_{out}$, and $V1_{out}$ (taking into account integration duration T0, T1 and T2) to produce a single high-dynamic-range image pixel value. The high-dynamic-range image pixel values of all pixels may be combined to form an HDR image captured using a global shutter operation.

Figure 6:
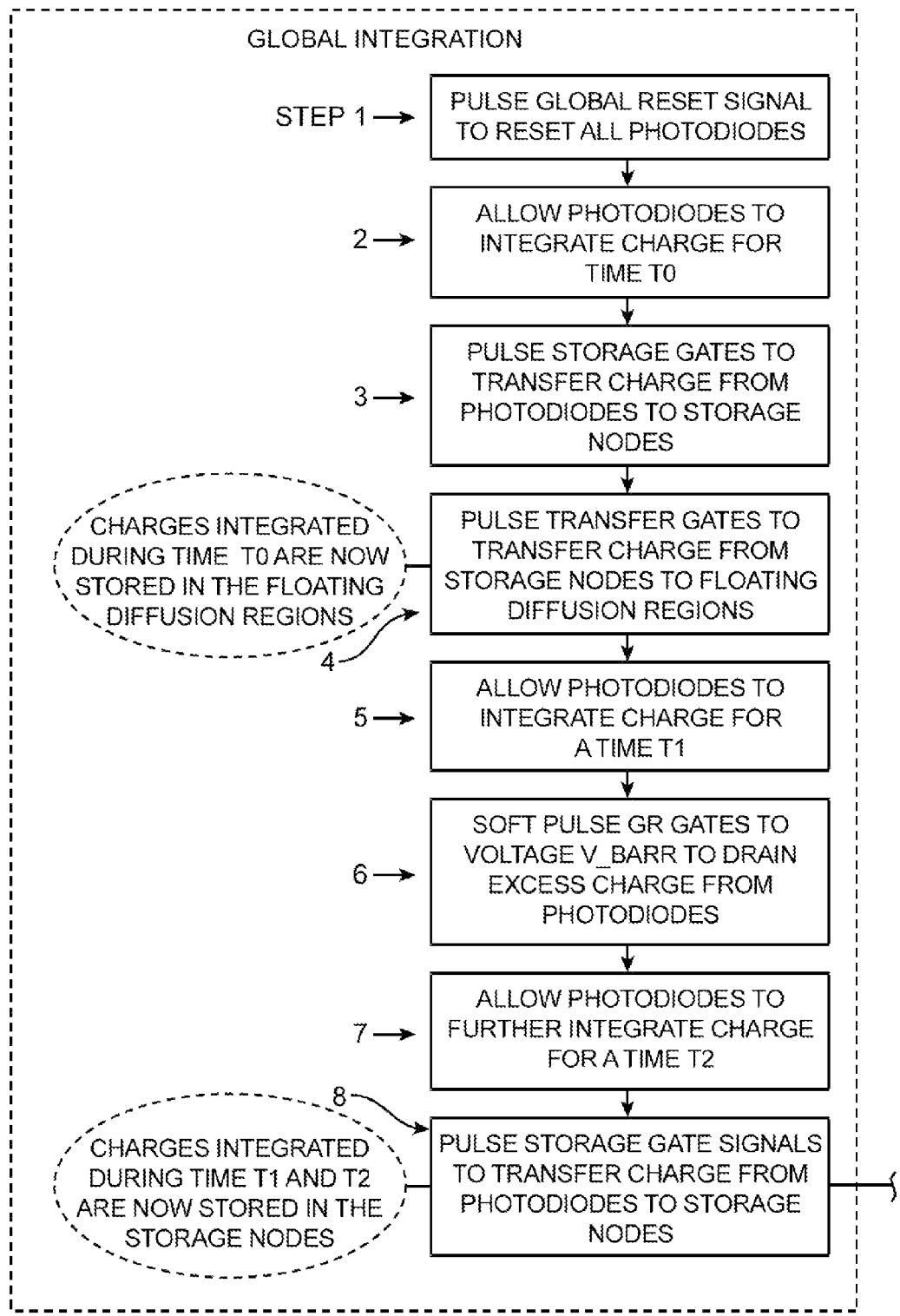
FIG. 6 is a flow chart of illustrative steps involved in capturing high-dynamic-range images using a scheme of the type shown in FIG. 5 in accordance with an embodiment of the present invention.
Figure 6:
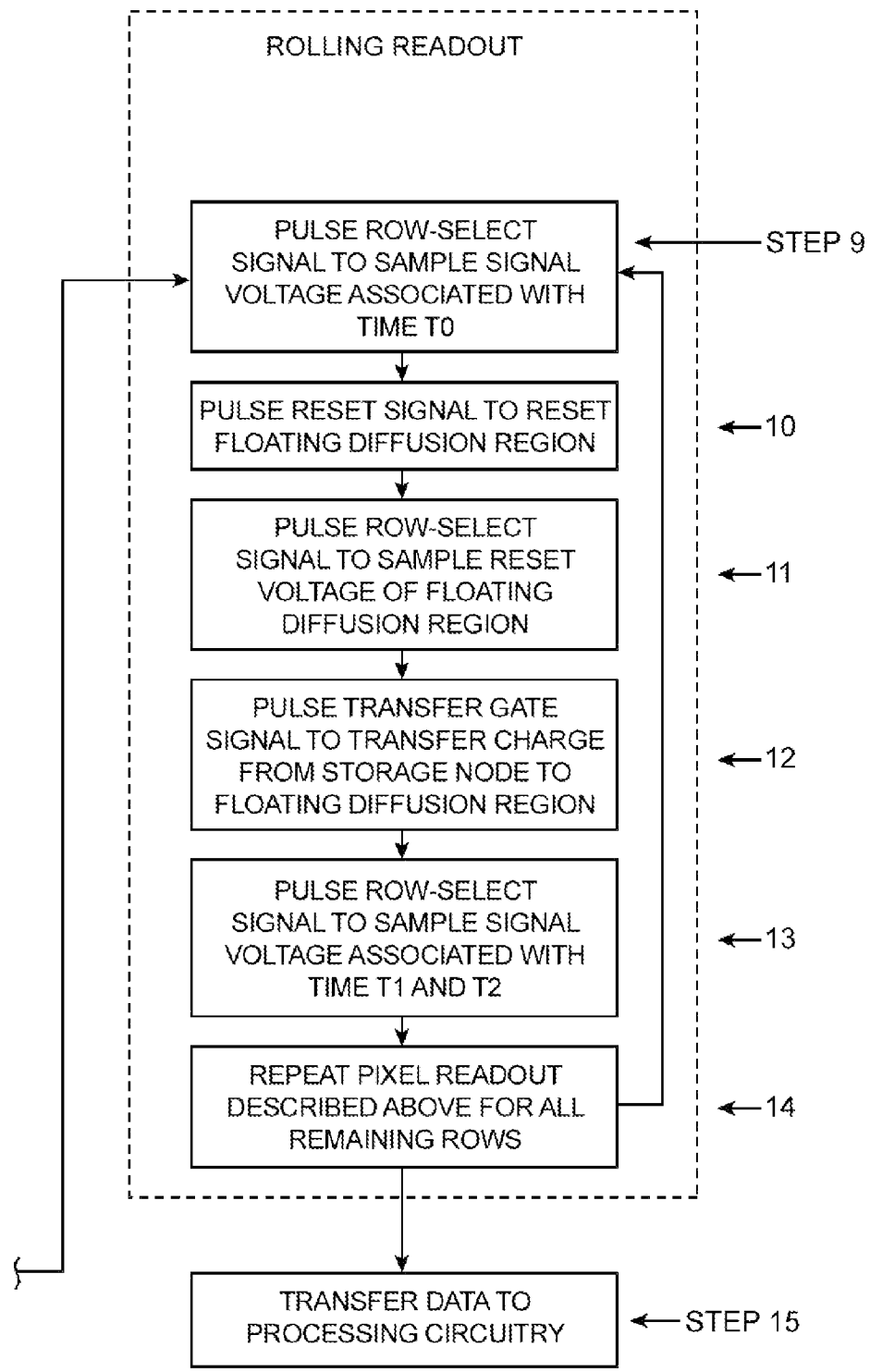

FIG. 6 is a flow chart of illustrative steps involved in generating image data to produce an HDR image using a global shutter scheme with at least three integration time periods. As shown in FIG. 6, steps 1-8 describe image capture operations that are performed globally (i.e., all pixels receive common global signals in parallel). Steps 9-15 describe readout operations that take place on a per-pixel-row basis.

At step 1 a global reset signal is asserted to reset all photodiodes. At step 2 all photodiodes collect charge for a first integration time t0. At step 3 storage transfer signal SG is asserted to transfer charges 112 from photodiodes 120 to storage regions 134. At step 4, transfer signal TX is asserted to transfer charges 112 from storage regions 134 to floating diffusion regions 128. FIG. 6 indicates that, after step 6, charges integrated during time T0 are stored on floating diffusion regions 128. At step 5, all photodiodes 120 collect charge for a second integration time T1. After time T1, at step 6, a "soft" reset signal GR is asserted to reset all photodiodes 120 to an intermediate barrier voltage $V_{barr}$. Photodiodes in pixels that have accumulated enough charge to exceed barrier voltage $V_{barr}$ are then reset to $V_{barr}$. Photosensors that have not accumulated enough charge to reach voltage $V_{barr}$ will not be affected by the "soft" reset. At step 7, all photodiodes 120 collect charge for a third integration time T2. At step 8, storage gate signal SG is pulsed high to transfer charges 114 from photodiodes 120 to storage regions 134. As shown in FIG. 6, after step 8, charges accumulated during integration times T1 and T2 that were not drained by soft reset signal GR may be stored on storage regions 134.

At step 9 row-select signal RS is asserted for a given row of pixels such as pixel 100 to begin a row by row readout operation of stored charge 112 and 114. At step 9, row-select signal RS is asserted to read out charge 112 stored on floating diffusion region 128 and accumulated during first integration time T0 to transfer output signal $V1_{out}$ onto an output path such as output path 46. At step 10, reset signal RST is pulsed high to reset floating diffusion region 128. In step 11, row-select signal RS is pulsed high to transfer reset signal $V_{rst}$ onto output path 46. At step 12, transfer signal TX is asserted to transfer charge 114 from storage region 134 to floating diffusion region 128. At step 13 row select signal RS is asserted to sample output signal $V2_{out}$ accumulated during second and third integration times T1 and T2.

At step 14 steps 9-13 are repeated for all pixel rows. At step 15, image data read out using this approach may then be passed to processing circuitry 18 for further processing. Processing circuitry 18 may then combine signal values $V_{rst}$, $V2_{out}$, and $V1_{out}$ (taking into account integration duration T0, T1 and T2) to produce a single high-dynamic-range image pixel value for each pixel. Combining signal values $V_{rst}$, $V2_{out}$, and $V1_{out}$ may comprise selecting one of $V2_{out}$, or $V1_{out}$ as the single high-dynamic-range image pixel value or using at least some portion of $V2_{out}$ or $V1_{out}$ as the high-dynamic-range image pixel value (taking into account integration duration T0, T1 and T2). The high-dynamic-range image pixel values of all pixels may be combined to form an HDR image captured using a global shutter operation.

Various embodiments have been described illustrating electronic devices such as portable electronic devices with image pixel arrays capable of capturing high-dynamic-range images using a global shutter operation. An image pixel array may include image pixels arranged in columns and rows. Each image pixel may include a photosensitive element, a floating diffusion region and a local storage region. The floating diffusion region may be used to store an amount of charge accumulated by the photosensitive element (sometimes called a photosensor) during a first charge integration period. The photosensor may be used to accumulate a second amount of charge during a second period of integration that is longer in duration than the first integration period. The photosensor may then be partially reset to drain excess charge accumulated during the second integration period to the power supply.

The photosensor may then accumulate charge for a third period of integration that is longer in duration than the first period of integration and shorter in duration than the second period of integration. Charge accumulated during the second integration period that was not drained during the partial reset operation, combined with charge accumulated during the third integration period may be transferred from the photosensor to the local storage region. In this manner, image data (charge) associated with at least three integration operations may be stored within the pixel providing a three-integration HDR image capture using a global shutter scheme. Image data accumulated and stored during the three different integration times may then be read out in a row-by-row readout operation and combined to form a single high-dynamic-range, global shutter image.

The foregoing is merely illustrative of the principles of this invention which can be practiced in other embodiments.

What is claimed is:

1. A method for capturing high-dynamic-range image data with an image pixel, wherein the image pixel comprises a photosensor, a first charge storage region, a second charge storage region, a charge readout circuit coupled between the second charge storage region and an output line, a first transistor coupled between the photosensor and the first charge storage region, and a second transistor coupled between the first charge storage region and the second charge storage region, the method comprising:
   accumulating a first amount of charge with the photosensor;
   transferring the first amount of charge from the photosensor to the second charge storage region using the first and second transistors;
   while the first amount of charge is stored on the second charge storage region, accumulating a second amount of charge with the photosensor; and
   while the first amount of charge is stored on the second charge storage region, transferring the second amount of charge from the photosensor to the first charge storage region with the first transistor without disturbing the first amount of charge stored on the second charge storage region, wherein accumulating the first amount of charge comprises accumulating charge for a first time period, wherein accumulating the second amount of charge comprises accumulating charge for a second time period, and wherein the first time period is shorter than the second time period, and wherein accumulating the charge for the second time period comprises:
   accumulating charge for a third time period;
   after accumulating the charge, partially resetting the photosensor; and
   after partially resetting the photosensor, accumulating additional charge for a fourth time period that is shorter than the third time period.

2. The method defined in claim 1 further comprising:
   with the charge readout circuit, supplying a first signal to the output line corresponding to the first amount of charge on the second charge storage region.

3. The method defined in claim 2 further comprising:
   following the supplying of the first signal to the output line with the charge readout circuit, transferring the second amount of charge from the first charge storage region to the second charge storage region with the second transistor.

4. The method defined in claim 3 further comprising:
   following the transferring of the second amount of charge from the first charge storage region to the second charge storage region with the second transistor, supplying a second signal to the output line corresponding to the second amount of charge using the charge readout circuit.

5. The method defined in claim 4 further comprising:
   before transferring the second amount of charge from the first charge storage region to the second charge storage region, resetting the second charge storage region.

6. The method defined in claim 5 further comprising:
   after resetting the second charge storage region and before transferring the second amount of charge from the first charge storage region to the second charge storage region, using the readout circuit and the output line to read out a signal from the second charge storage region.

7. The method defined in claim 6 wherein the charge readout circuit comprises a source follower transistor having a gate coupled to the second charge storage region and wherein using the readout circuit and the output line to read out the signal from the second charge storage region comprises using the source follower transistor to supply the signal to the output line.

8. The method defined in claim 1 wherein the fourth time period is longer than the first time period.

9. The method defined in claim 8 wherein the output line is coupled to processing circuitry and wherein the first amount of charge and the second amount of charge are combined to form a single high-dynamic-range image pixel value with the processing circuitry.

10. A method for capturing high-dynamic-range image data with an image pixel array using a global shutter scheme, wherein the image pixel array comprises a plurality of image pixels, wherein each image pixel comprises a photosensor, a first charge storage region, a second charge storage region, a charge readout circuit, and a reset transistor, the method comprising:
   asserting a global reset signal to reset the photosensor in each image pixel;
   for a first time period, accumulating a first amount of charge with the photosensor in each image pixel;
   storing the first amount of charge on the second charge storage region in each image pixel;
   for a second time period, accumulating a second amount of charge with the photosensor in each image pixel; and
   while the first amount of charge is stored on the second charge storage region, storing the second amount of charge on the first charge storage region in each image pixel without disturbing the first amount of charge stored on the second charge storage region of each image pixel, wherein accumulating the second amount of charge with the photosensor in each image pixel comprises:
  accumulating charge with the photosensor in each image pixel for a third time period;
  after accumulating the charge with the photosensor in each image pixel, draining excess charge accumulated during the third time period from the photosensor of each image pixel through the reset transistor of each image pixel; and
  after draining the excess charge, accumulating additional charge for a fourth time period, wherein the fourth time period is shorter than the third time period, and wherein the fourth time period is longer than the first time period.

11. The method defined in claim 10, wherein the image pixels of the image pixel array are arranged in rows and columns, wherein each of the image pixels further comprises an additional reset transistor, wherein the charge readout circuit of each image pixel comprises a row-select transistor, wherein the row-select transistor of each image pixel along a column receives a respective one of a plurality of row-select signals, and wherein the readout circuit of each image pixel along a column is coupled to an associated column output line, the method further comprising:
  asserting a selected one of the row-select signals to select an image pixel in each column, wherein the selected image pixel in each column is configured to supply a first output signal corresponding to the first amount of charge stored on the second charge storage region to the associated column output line;
  resetting the second charge storage region of the selected image pixel in each column to a reset voltage using the additional reset transistor;
  asserting the selected one of the row-select signals to configure the selected image pixel in each column to supply a reset signal corresponding to the reset voltage to the associated column output line;
  transferring the second amount of charge stored on the first charge storage region to the second charge storage region for each of the selected image pixel in each column; and
  asserting the selected one of the row-select signals to configure the selected image pixel in each column to supply a second output signal corresponding to the second of charge stored on the first charge storage region to the associated column output line.

12. The method defined in claim 11 wherein the column output line is coupled to processing circuitry, the method further comprising:
  with the processing circuitry, generating a high-dynamic-range pixel value based on the first and second output signals and the reset signal of each image pixel; and
  generating a high-dynamic-range image with the high-dynamic-range pixel values of each image pixel.

13. A method for capturing high-dynamic-range images using a global shutter scheme with an electronic device, wherein the electronic device comprises an image pixel array, control circuitry, and processing circuitry, wherein the image pixel array comprises a plurality of image pixels arranged in rows and columns, and wherein each image pixel comprises a photosensor, a first charge storage region, a second charge storage region, and a charge readout circuit the method comprising:
  with the control circuitry, asserting a global reset signal to reset the image pixel array;
  during a first integration time period, storing a first image on the first charge storage regions of the image pixels; and
  storing a second image on the second charge storage regions of the image pixels without disturbing the first image stored on the first charge storage regions of the image pixels, wherein storing the second image on the second charge storage regions comprises:
    during a second integration time period, accumulating charge with the photosensor in each of the plurality of image pixels;
    partially resetting the photosensor in each of the plurality of image pixels to an intermediate voltage;
    during a third integration time period, accumulating charge with the photosensor in each of the plurality of image pixels; and
    transferring the charge accumulated during the second and third integration time periods to the second storage regions of the image pixels, wherein the second integration time period is longer than the third integration time period, and wherein the third integration time period is longer than the first integration time period.

14. The method defined in claim 13, wherein each image pixel further comprises a reset transistor, the method further comprising:
  with the charge readout circuit, reading out a first signal that is associated with the first image;
  for each image pixel, enabling the reset transistor to reset the first charge storage region to a reset voltage;
  with the charge readout circuit, reading out a second signal that is associated with the reset voltage;
  for each image pixel, transferring the second image from the second charge storage region to the first charge storage region;
  with the charge readout circuit, reading out a third signal that is associated with the second image; and
  with the processing circuitry, producing a high-dynamic-range image based on the first, second, and third signals.

* * * * *